United States Patent [19]
Baldi et al.

[11] Patent Number: 4,968,645
[45] Date of Patent: Nov. 6, 1990

[54] METHOD FOR MANUFACTURING MOS/CMOS MONOLITHIC INTEGRATED CIRCUITS INCLUDING SILICIDE AND POLYSILICON PATTERNING

[75] Inventors: Livio Baldi, Agrate Brianza; Paolo G. Cappelletti, Seveso; Franco Maggioni, Missagllia, all of Italy

[73] Assignee: SGS-Thomson Microelectronics S.r.l., Milan, Italy

[21] Appl. No.: 289,391

[22] Filed: Dec. 15, 1988

Related U.S. Application Data

[62] Division of Ser. No. 940,501, Dec. 11, 1986, abandoned.

[30] Foreign Application Priority Data

Dec. 20, 1985 [IT] Italy .................................. 23323 A/85

[51] Int. Cl.[5] .......................................... H01L 21/283
[52] U.S. Cl. .................................... 437/200; 437/192; 437/193; 437/918; 437/985; 148/DIG. 19; 148/DIG. 136; 148/DIG. 106
[58] Field of Search .............. 437/200, 918, 192, 193, 437/40, 41, 56, 57, 58, 985; 148/DIG. 19, DIG. 136, DIG. 106

[56] References Cited

U.S. PATENT DOCUMENTS

| | | | |
|---|---|---|---|
| 3,777,364 | 12/1973 | Schirella et al. | 148/DIG. 147 |
| 4,329,706 | 5/1982 | Crowder et al. | 357/71 |
| 4,398,335 | 8/1983 | Lehrer | 357/71 |
| 4,443,930 | 4/1984 | Hwang et al. | 437/200 |
| 4,445,134 | 4/1984 | Miller | 357/71 |
| 4,446,613 | 5/1984 | Beinglass et al. | 437/918 |
| 4,519,126 | 5/1985 | Hsu | 457/200 |
| 4,569,122 | 2/1986 | Chan | 148/DIG. 147 |
| 4,581,815 | 4/1986 | Cheung et al. | 437/200 |
| 4,604,789 | 8/1986 | Bourassa | 437/918 |
| 4,621,276 | 11/1986 | Malhi | 357/31 |
| 4,643,777 | 2/1987 | Maeda | 437/918 |
| 4,682,402 | 7/1987 | Yamaguchi | 148/DIG. 136 |

FOREIGN PATENT DOCUMENTS

WO85/04049 9/1985 PCT Int'l Appl. .

*Primary Examiner*—Brian E. Hearn
*Assistant Examiner*—T. N. Quach
*Attorney, Agent, or Firm*—Jones, Askew & Lunsford

[57] ABSTRACT

A monolithic integrated circuit of either the MOS or CMOS type comprises an intermediate layer of polycrystalline silicon, a layer of a silicide of a refractory metal overlying said polycrystalline silicon layer, and regions of preset area and preset paths formed in the polycrystalline silicon layer and the silicide layer; the preset area regions and preset paths forming respectively high resistivity resistances and low resistivity interconnection lines for an intermediate connection level.

3 Claims, 5 Drawing Sheets

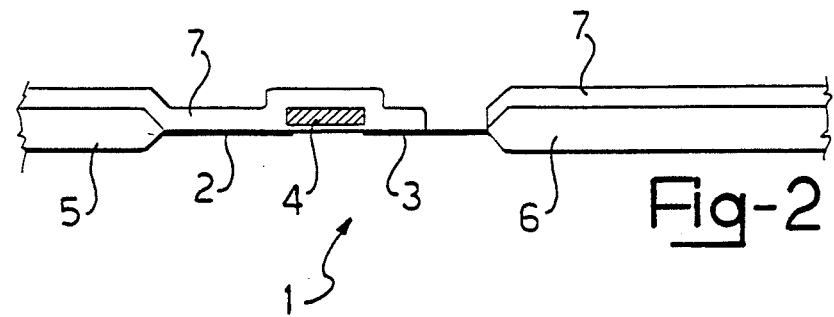
Fig-2
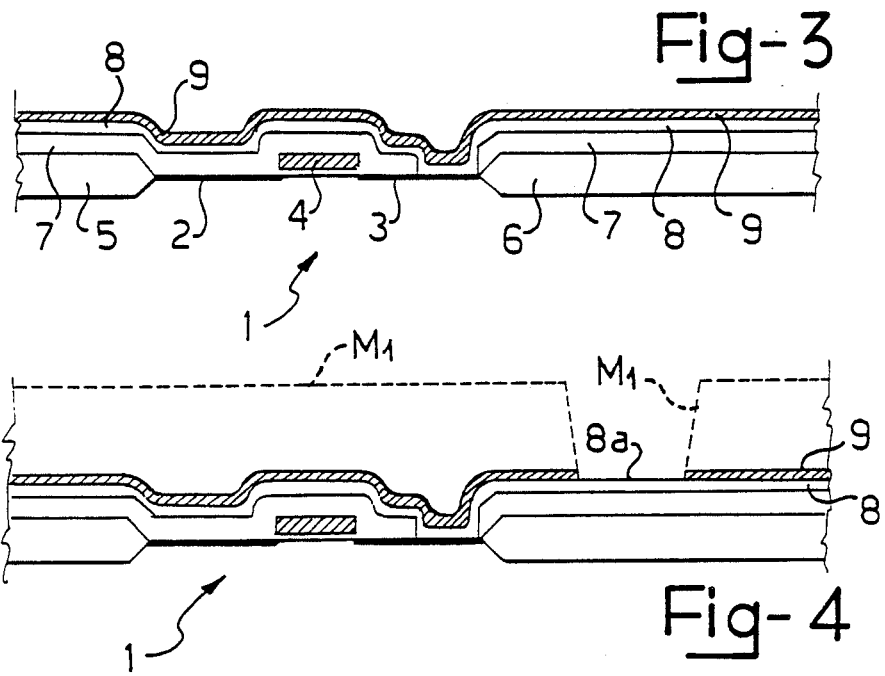
Fig-3
Fig-4
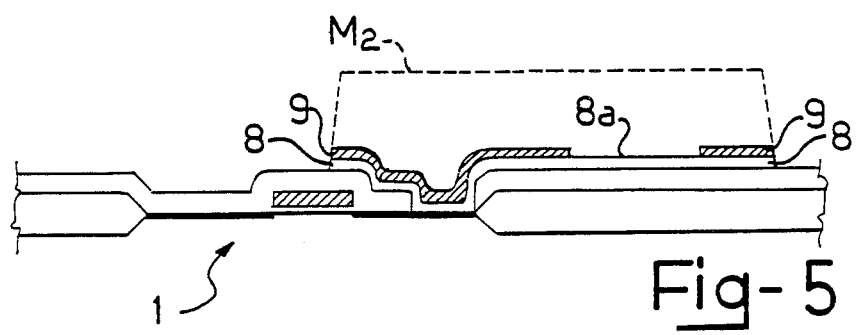
Fig-5

METHOD FOR MANUFACTURING MOS/CMOS MONOLITHIC INTEGRATED CIRCUITS INCLUDING SILICIDE AND POLYSILICON PATTERNING

This is a division of application Ser. No. 940,501, filed Dec. 11, 1986, now abandoned.

DESCRIPTION

This invention relates to a monolithic integrated circuit, in particular of either the MOS (Metal-Oxide-Semiconductor) or CMOS (Complementary MOS) type.

The circuit of this invention is an integrated circuit (IC) having at least one intermediate connection level which comprises a layer of polycrystalline silicon and a layer of refractory metal silicide overlying the polycrystalline silicon layer.

As is known, the structure of monolithic ICs comprises essentially a chip of a semiconductor material wherein appropriate active and passive electronic components for the intended circuit are formed.

Such components are interconnected by a set of connection levels or planes which are separated from one another by layers of a dielectric material.

The first or innermost connection level in the structure is the so-called diffusion or junction level, the last level being referred to as the metallization level inasmuch as it comprises a metal, e.g. aluminum, layer which is formed closer to the surface of the integrated circuit. It is indeed in this metal layer that the electric contacts are formed for external connection of the circuit.

It is common practice with current IC manufacturing techniques to have one or more intermediate layers of polycrystalline silicon, on account its well-recognized ability to withstand heat treatment. Moreover, a uniform continuous layer of polycrystalline silicon may be also formed along any corner edges present in the underlying structure by means of vapor phase chemical reaction deposition techniques.

The polycrystalline silicon resistivity is, however, several orders higher than that of the metal in the last connection level; where different elements of the integrated circuit are to be connected by means of polycrystalline silicon, the higher resistivity of the latter over the metal poses serious problems, such as a much "slower" IC performance.

In an attempt to obviate such problems, two different approaches have been proposed heretofore. A first one consists of heavily doping the polycrystalline silicon layer to reduce its resistivity; however, this solution is still incompatible with the conduction rates required of ICs.

A second approach provides for deposition of a layer of silicides of such refractory metals as titanium, tantalum and tungsten over the polycrystalline silicon layer. Refractory metal silicides have high properties of conductivity and resistance to heat treatment, and form accordingly a good additional intermediate connection level. However, they have the drawback of being incompatible with high resistivity resistors, thereby they restrict the possibility of utilizing in an optimum manner, through appropriate circuit arrangements, the availability of an additional connection level in the structure of these ICs.

The problem underlying this invention is to provide a monolithic integrated circuit of either the MOS or CMOS type whose structure comprises an intermediate connection level wherein low resistivity interconnection lines and high resistances are formed.

This problem is solved, according to the invention, by an integrated circuit of the type specified above being characterized in that preset area regions and at least one preset path are formed in said polycrystalline silicon layer and said silicide layer, respectively, said preset area regions forming resistors and said at least one preset path forming at least one line of interconnection for said intermediate connection level.

Further features and the advantages of this invention will be more clearly understood from the following description of an exemplary embodiment of the inventive integrated circuit and examples of method of manufacturing it, the description being given herein by way of illustration and not of limitation with reference to the accompanying drawings.

BRIEF DESCRIPTION OF THE DRAWING

In the drawings:

FIGS. 2 to 5 are views showing diagramatically successive steps of a method according to the invention for the manufacture of the IC shown in FIG. 1;

DESCRIPTION OF THE PREFERRED EMBODIMENTS

Figure 1:
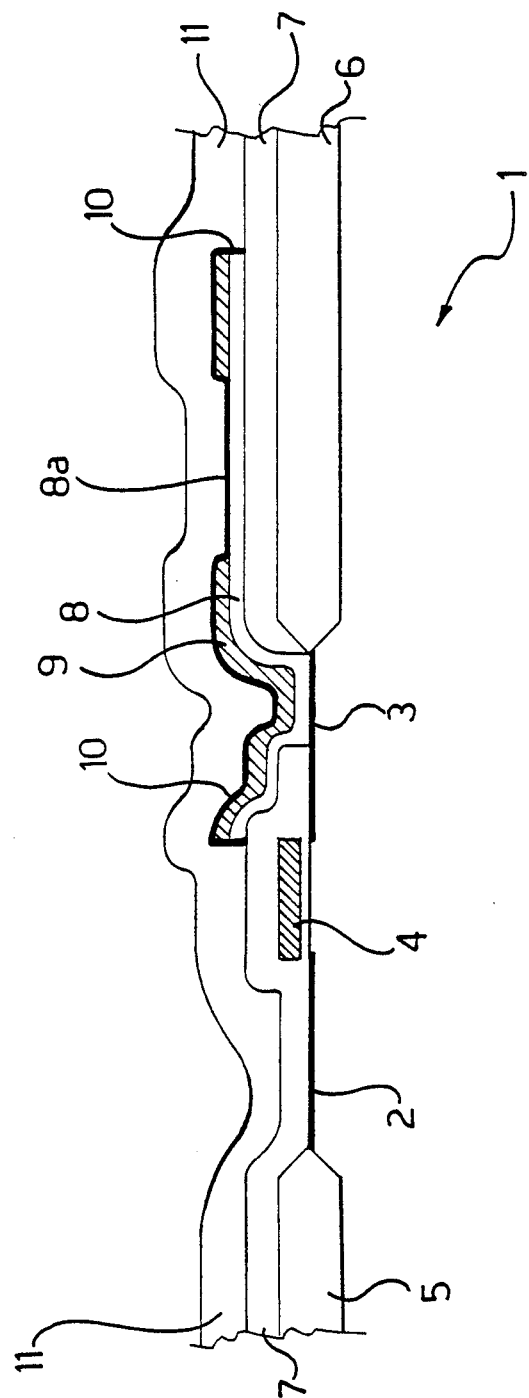
FIG. 1 is a sectional, fragmentary side view showing diagramatically the structure of an IC according to the invention.

With reference to the drawing figures, and in particular to FIG. 1, a monolithic integrated circuit of the MOS type is partly depicted there which is indicated at 1.

The integrated circuit 1 has a structure which comprises conventional source 2, drain 3, and gate 4, formed in polycrystalline silicon.

The structure of the integrated circuit 1 further comprises two insulation regions 5 and 6 formed at the source 2 and drain 3, respectively.

The source 2, drain 3, and gate 4 constitute conventionally a first interconnection level, referred to as the junction (2,3) and gate (4) level.

A layer 7 of a dielectric material overlies said first interconnection level and is disjoined at a portion of the drain 3.

The integrated circuit of this invention comprises, therefore, a layer 8 of polycrystalline silicon overlying the dielectric layer 7, and in the example shown, contacting that portion of the drain 3 which is not covered with dielectric.

Furthermore, a layer 9 of refractory metal silicide, e.g. $TaSi_2$ or $WSi_2$ or $TiSi_2$, overlies the polycrystalline silicon layer 8.

Figure 11:
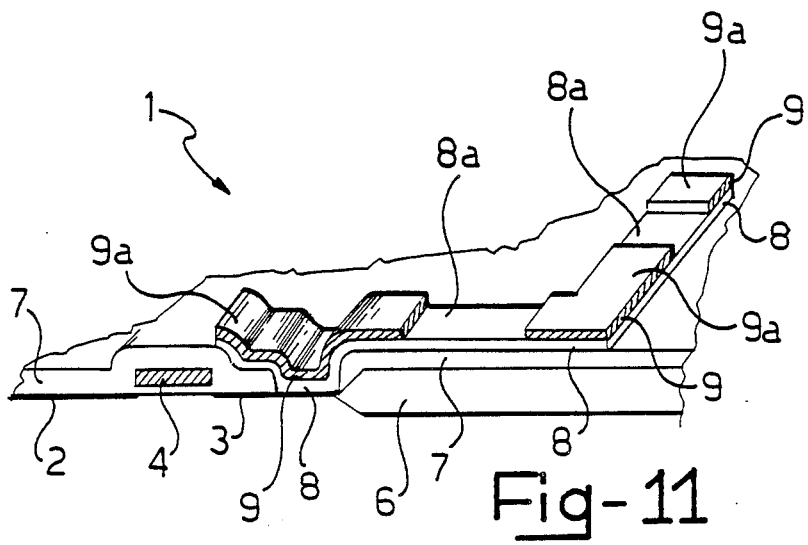
FIG. 11 is an out-of-scale perspective view of a detail of FIG. 1.

It should be noted that the silicide layer 9 is disjoined at preset area regions defined in the layer 8 of polycrystalline silicon, in the example shown the preset area region being indicated at 8a, and that in that silicide layer there are formed, accordingly, preset paths 9a, such as, for example, the path 9a in FIG. 11.

The layer 8 of polycrytalline silicon wherein the preset area regions 8a are formed, and the silicide layer 9 wherein the preset paths 9a are formed, constitute an additional intermediate interconnection level of the inventive IC 1. Furthermore, the regions 8a constitute resistors and the paths 9a lines of interconnection for said intermediate connection level.

The integrated circuit 1 further comprises a protective oxide layer 10 overlying the silicide layer 9 and preset area regions 8a, as well as a successive passivation layer 11.

The structure of the integrated circuit 1 also includes further layers, not shown in the drawings because quite conventional.

Advantageously, the IC described above is manufactured, in accordance with this invention, by a method that will be described herein below with reference to FIGS. 2 to 5.

The method follows conventional procedures as far as the formation of the gates 4, sources 2, and drains 3 in the first connection level, thereafter a conventional layer 7 of a dielectric material is formed over the entire circuit 1, typically in part by thermal oxidation and in part by deposition.

At this stage, the method provides a dielectric layer 7 masking and etching step, in accordance with well-known techniques, in order to establish direct contacts between the first connection level and the outside (see FIG. 2); in the example considered, the contact is established at the drain 3.

The method of this invention comprises a step of depositing a polycrystalline silicon layer 8 having a thickness or depth dimension within the range of 1,500 to 2,500 Å, followed by a step of depositing a layer 9 of a refractory metal silicide having comparable thickness.

Over the silicide layer 9, there is laid a mask M1, known per se, and preset area regions 8a are defined whereat the silicide is then removed by selective etching to provide resistors in an intermediate connection level which are formed in the polycrystalline silicon layer at the preset area regions 8a.

The method provides then for application of a mask M2 over the silicide layer 9 and at the regions 8a, to define preset paths 9a which constitute lines of interconnection for said intermediate connection level, formed within the silicide layer.

The silicide and polycrystalline silicon outside of the mask M2 are removed in a conventional manner, and this is followed by formation of a protective oxide layer 10 and deposition of a successive passivation layer 11.

At this stage, and similarly to known prior methods, one would proceed with establishing the contacts and depositing one or more metal layers.

Advantageously, where it is required that the resistors formed in the regions 8a have different resistivity values from the inherent one of polycrystalline silicon, the inventive method would provide an intermediate step of polycrystalline silicon doping by boron ion implantation, for example.

Alternatively to the first-mentioned, and preferred, embodiment of the method according to the invention, a second embodiment of the method of manufacturing these ICs comprises initial application of a mask M3 over the silicide layer 9, defining predetermined area regions 8a and preset paths 9a so as to form the interconnection lines for the intermediate connection layer.

Figure 6:
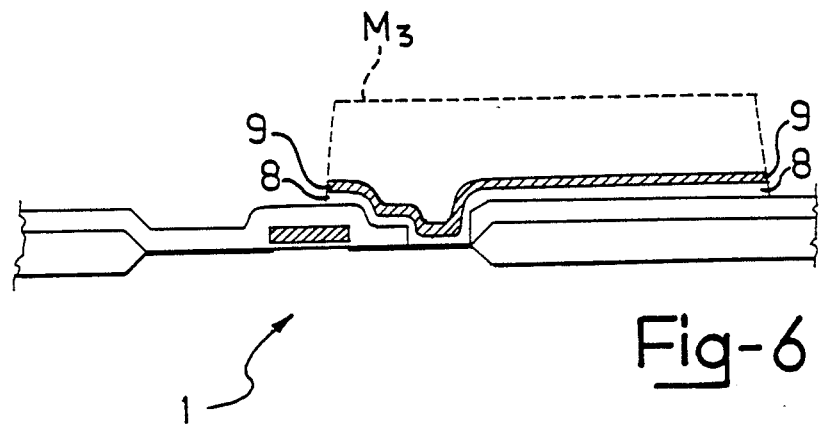
FIGS. 6 and 7 are diagramatic views of successive steps of a second embodiment of the inventive method.
Figure 7:
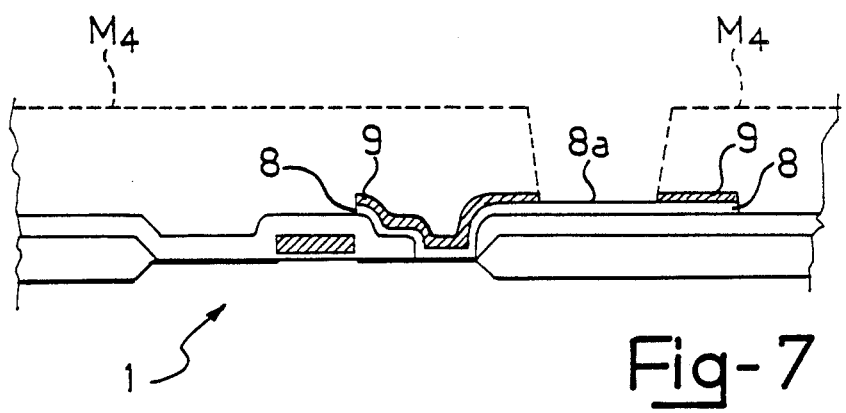

The silicide and polycrystalline silicon outside of the mask M3 (see FIG. 6) are removed next, and a mask M4 is laid over the silicide layer 9 to define predetermined area regions 8a.

The silicide would be removed by conventional selective etching from the predetermined area regions 8a, thereafter one proceeds as in the first embodiment of the method.

It should be noted that where the refractory metal silicide is obtained by known techniques of deposition of a refractory metal onto the polycrystalline silicon, followed by alloying treatments, a third embodiment of the inventive method is provided as explained herein below.

One proceeds as in the preceding examples as far as the deposition of the polycrystalline silicon layer 8, which would have in this instance an advantageously increased thickness dimension, in the 3,000 to 4,000 Å range, thereafter the polycrystalline silicon layer 8 is surface oxidized to form an oxide layer 12.

Figure 8:
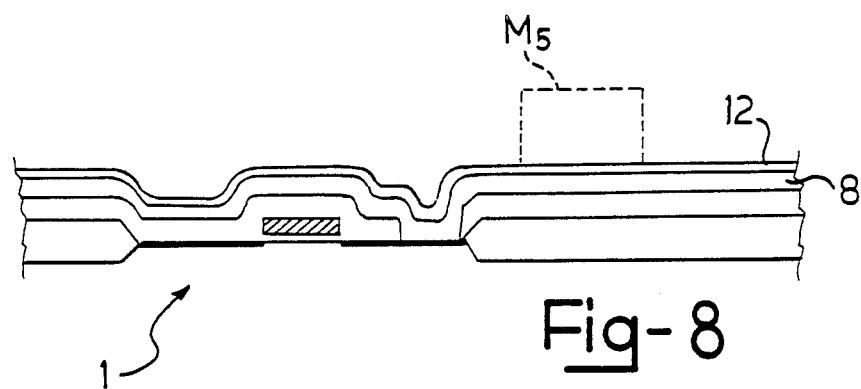
FIGS. 8 to 10 are diagramatic views of successive steps of a third embodiment of the inventive method.
Figure 9:
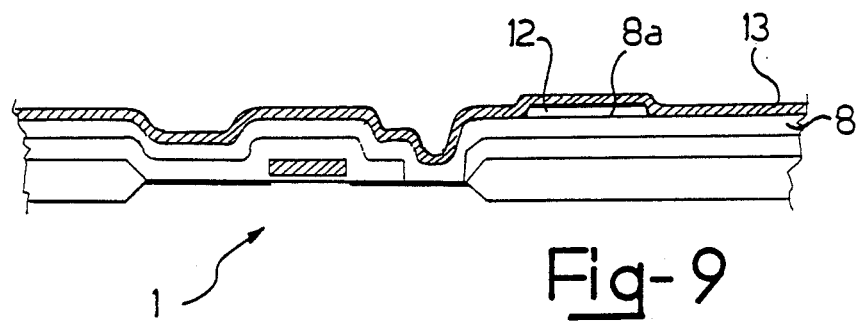

A mask M5, known per se, is laid over the oxide layer 12 (see FIG. 8) to define the preset area regions 8a and form resistors for an intermediate connection level, and the polycrystalline silicon oxide is then removed from outside such regions.

A layer 13 of a refractory metal is then deposited over the layer 8 of polycrystalline silicon and the regions 8a protected by the oxide, and the refractory metal is subjected to a conventional alloying heat treatment with the polycrystalline silicon to form a layer 9 of silicide of said refractory metal.

Subsequently to this, unreacted refractory metal, located in the regions 8a, is removed by selective etching in conformity with known techniques.

Figure 10:
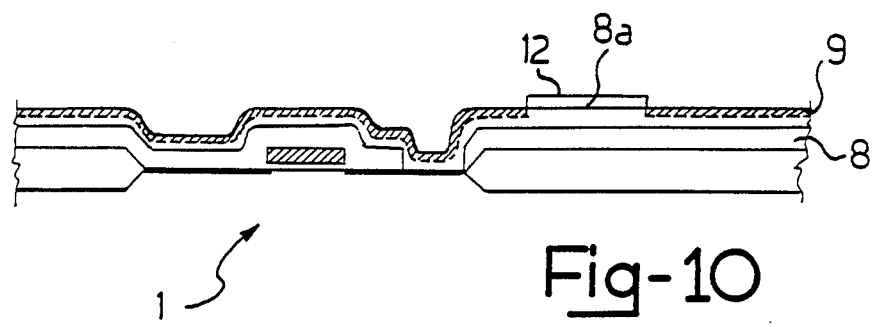

Of course, in this third embodiment of the inventive method, the layer 8 of polycrystalline silicon would no longer be distinctly separated from the silicide layer 9 (see FIG. 10), unlike the exemplary embodiments previously discussed.

At this point, one proceeds with defining the preset paths 9a and preset area regions 8a using similar procedures to those for the previous embodiments.

In addition, this third embodiment of the method according to the invention may also advantageously include a doping step by ion implantantion of the polycrystalline silicon, and such a step, if found desirable, may take place at any stage of the method.

It is important to observe that, while the monolithic IC and its respective three method embodiments according to the invention as disclosed in the foregoing refer to ICs of the MOS type, the invention is obviously applicable to CMOS-type integrated circuits as well, by including accordingly conventional masking and doping steps for the components sought in the integrated circuit and taking care to suitably mask off the resistors formed at the preset area regions.

The integrated circuit of this invention will include, therefore, an additional intermediate connection level which is highly effective and meets the requirements of modern monolithic ICs.

Further, in that intermediate connection level, the preset connection lines exhibit low resistivity, and the resistors may achieve high resistivity values on all occasions controllable contingent on requirements.

A further advantage afforded by this invention is that this method of manufacturing ICs according to the invention may be implemented in a wide range of different conditions, using for masking and selective etching purposes those materials and techniques which are more likely to meet specific demands.

I claim:

1. A method of manufacturing a monolithic integrated circuit of either the MOS or CMOS type, comprising the following sequential steps of:

providing a layer of polycrystalline silicon;

depositing a layer of a silicide of a refractory metal over said layer of polycrystalline silicon;

applying a mask onto said silicide layer to define regions of preset area;

removing the silicide from said preset area regions to form resistance in an intermediate connection level;

applying a mask onto said silicide layer and said regions to define preset paths adapted to form interconnection lines for said intermediate connection level; and removing the silicide layer and polycrystalline silicon layer from outside said mask.

2. A method of manufacturing a monolithic integrated circuit of either the MOS or CMOS type, comprising the following sequential steps of:

providing a layer of polycrystalline silicon;

depositing a layer of a silicide of a refractory metal over said layer of polycrystalline silicon;

applying a mask onto said silicide layer to define regions of preset area and preset lines adapted to form interconnection lines for an intermediate connection level;

removing the silicide layer and polycrystalline silicon layer from outside said mask;

applying a mask onto said silicide layer to define said preset area regions; and removing the silicide from said preset area regions forming resistance in said intermediate connection level.

3. A method according to any of claims 1 or 2, comprising an intermediate step of doping said polycrystalline silicon layer by ion implantation.

* * * * *